(12) United States Patent
James et al.

(10) Patent No.: US 6,221,459 B1
(45) Date of Patent: *Apr. 24, 2001

(54) CONTROLLING THE HEAT EXPANSION OF ELECTRICAL COUPLINGS

(75) Inventors: Gregory A. James, San Jose, CA (US); Kristopher J. Frutschy, Phoenix, AZ (US); Larry L. Moresco, San Carlos, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,537

(22) Filed: Nov. 30, 1998

(51) Int. Cl.[7] ................................................. H01R 12/14
(52) U.S. Cl. .................. 428/105; 428/114; 428/292.1; 442/6; 442/15; 442/19; 174/145; 439/65; 439/66; 439/91
(58) Field of Search .................... 442/6, 15, 19; 428/105, 114, 292.1; 174/145; 439/65, 66, 91

(56) References Cited

U.S. PATENT DOCUMENTS

| | | | |
|---|---|---|---|
| 4,330,165 | 5/1982 | Sado | 339/59 M |
| 4,518,648 | * 5/1985 | Miyata et al. | 428/256 |
| 4,828,639 | * 5/1989 | Aker et al. | 156/245 |
| 5,168,432 | * 12/1992 | Murphy et al. | 361/421 |
| 5,324,205 | * 6/1994 | Ahmad et al. | 439/66 |

FOREIGN PATENT DOCUMENTS

| | | |
|---|---|---|
| 0 431 566 A1 | 6/1991 | (EP). |
| 0 574 715 A1 | 12/1993 | (EP). |
| 0 717 471 A2 | 6/1996 | (EP). |
| 2 155 251 | 9/1985 | (GB). |

* cited by examiner

Primary Examiner—Elizabeth M. Cole
(74) Attorney, Agent, or Firm—Trop, Pruner & Hu, P.C.

(57) ABSTRACT

A coupling such as a socket may couple one electronic device to another and may reduce differential thermal expansion between the two coupled devices. For example, a surface mount socket may differentially expand relative to a printed circuit board. By incorporating a structure having a coefficient of thermal expansion that matches the coefficient of thermal expansion of the printed circuit board, differential thermal expansion may be lessened and the possibility of mechanical damage may be reduced.

20 Claims, 1 Drawing Sheet

CONTROLLING THE HEAT EXPANSION OF ELECTRICAL COUPLINGS

BACKGROUND

This invention relates generally to electrical couplings that mechanically couple one electrical component to another in a fashion that heat expansion of one component affects the other component.

Many electrical connectors physically and electrically connect one electronic device to another. For example, a variety of sockets may be used to connect one packaged integrated circuit electronic device to a printed circuit board. Thus, the connector or socket physically connects the two elements together and provides for electrical communication between the two devices.

In some cases, when the devices are exposed to high temperatures, failure may occur due to the differential thermal expansion of the physically connected devices. If one device expands more than the other, and the devices have a physical connection between them, one of the devices may fail mechanically either at the physical connection or in portions mechanically coupled to the physical connection.

One example of a situation where such failures may occur is in connection with surface mount packages. Surface mount packages connect to printed circuit boards by heat bonding or soldering the package to the board. Instead of using electrical pins and plugs (like conventional electrical outlets utilize), heat bonded or soldered electrical connections can be done quickly and in an automated fashion.

However, when a connector is exposed to heat, it normally expands. When it is in physical contact with one or more other devices, and those devices have different coefficients of thermal expansion, failure of the connection between the components may result. In many cases, the properties of a material that make it a good connector material may make the material a poor material for other applications. Therefore, when materials with different coefficients of thermal expansion are physically connected together, and exposed to heat, the possibility of mechanical failure exists.

Thus, there is a continuing need for a way to reduce differential heat expansion between electrical components.

SUMMARY

In accordance with one embodiment, an electrical coupling includes a body and a structure coupled to the body. The structure limits the thermal expansion of the body.

DETAILED DESCRIPTION

Figure 1:
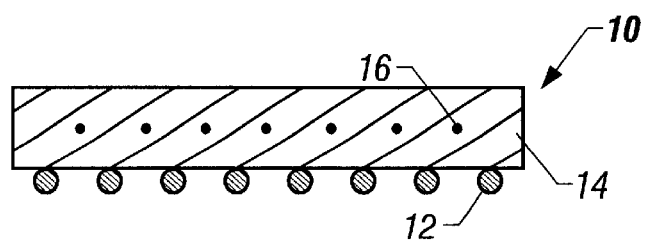
FIG. 1 is an enlarged cross-sectional view of a socket in accordance with one embodiment of the invention.

Referring to FIG. 1, an electrical connector 10 may be utilized to couple one or more electrical components or devices together. The connector 10 provides both an electrical and a mechanical coupling between the components.

In one embodiment, the connector 10 may be a surface mount socket which allows one electrical component to be coupled by surface mounting techniques to another electrical component. The connector 10 may include a body 14 which, in one embodiment, may be formed of molded plastic. A plurality of surface mount contacts 12 which, in one embodiment of the invention, may be solder balls for implementing a ball grid array socket are secured to the connector 10. While the connector 10 may use a variety of other electrical connection techniques, surface mount connections are desirable in one embodiment.

Extending through the body 14 is a thermal expansion controlling structure 16. The structure 16 limits the thermal expansion of the body 14. Thus, in general, the structure 16 has a lower coefficient of thermal expansion than the body 14 and thereby limits its thermal expansion if it is bonded to the structure 16 and if the structure 16 has a stiffness greater than or equal to that of the body 14. In one embodiment of the invention, the structure 16 may be formed of a plurality of discrete elements 16 which may be connected to the body 14 by a variety of conventional techniques, including overmolding the structure 16 into the body 14.

The components forming the structure 16 may be filamentary. Corresponding elements of the structure 16 may extend in other directions to provide thermal stability in those directions as well. For example, a criss-cross pattern of filamentary elements may form the structure 16, limiting thermal expansion in at least two directions.

In one embodiment of the invention, the structure 16 may be formed of metallic filaments. For example, one advantageous filament material is copper. In some cases, copper dominates the thermal characteristics of electronic devices to which the connector 10 may be coupled. For example, printed circuit boards (PCBs) have mechanical characteristics, which in some cases, may be strongly influenced by their copper conductors which traverse the PCB. Thus, the thermal characteristics (and particularly the thermal expansion characteristics) of the connector 10 may be matched to those of devices to which the connector 10 may be mechanically secured. Where those devices are characterized by the thermal characteristics of copper, making the structure 16 of copper wire may be advantageous.

While the structure 16 is illustrated as being a plurality of copper wires, other metals may be used as well. In addition, fibers may be used which have desirable thermal expansion characteristics. In general, any structure 16 which matches or causes the aggregate characteristics to match the thermal expansion characteristics of a device to which the connector 10 is coupled may provide enhanced thermal characteristics.

Figure 2:
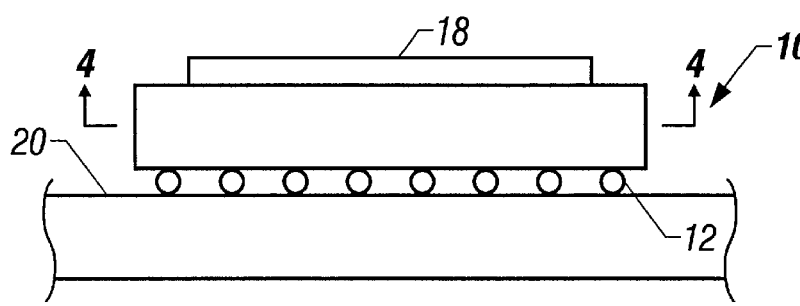
FIG. 2 is a side elevational view of the socket shown in FIG. 1 in position between an integrated circuit package and a printed circuit board.

Turning now to FIG. 2, the connector 10 may couple a pair of electronic devices 18 and 20. In the embodiment illustrated in FIG. 2, the electronic device 18 may be a packaged integrated circuit device. The electronic device 20 may be a printed circuit board. Thus, if the connector 10 is a surface mount socket, the contacts 12 may form a surface mount connection to the electronic device 20 (for example, a PCB). However, the connection between the devices 10 and 18 may take a variety of other forms as well.

In one illustrative embodiment, a pin and hole connection or pin grid array (PGA) technique may be used to connect the devices 10 and 18 while a surface mount technique may be used to connect the devices 10 and 20. However, the scope of the present invention is in no way limited to the particular connection technique utilized.

Figure 3:
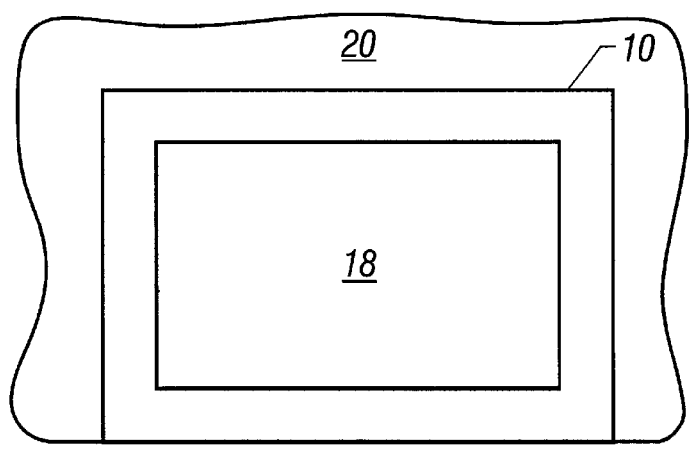
FIG. 3 is a top plan view of the embodiment shown in FIG. 2.
Figure 4:
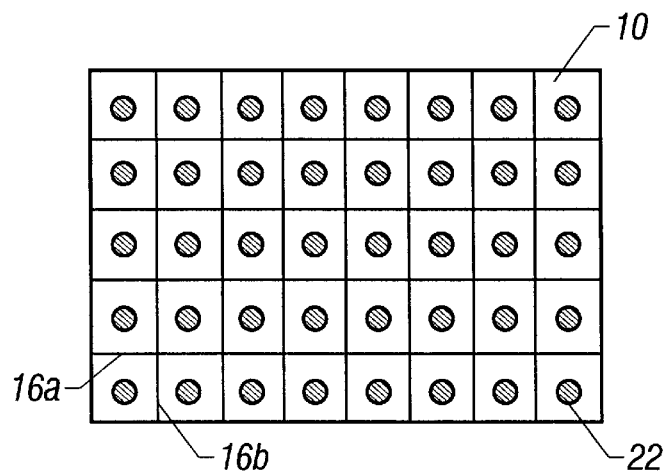
FIG. 4 is a cross-sectional view taken generally along the line 4—4 in FIG. 2.

Referring now to FIG. 3, a surface mount connection may be achieved between the connector 10 and the electronic device 20 which may be a PCB. With the electronic device 18 removed and in an embodiment in which a pin and hole connection technique is utilized, as shown in FIG. 4, the connector 10 may include a plurality of holes 22 which receive pins on the electronic device 18 and provide both an electrical and a mechanical connection. The structure 16 in the embodiment illustrated in FIG. 4 is formed of a transverse network of filaments 16a and 16b. The filaments may be formed in the connector 10, extending through the region between adjacent rows and columns of holes 22. Thus, the structure 16 may achieve desirable thermal characteristics without adversely affecting the electrical characteristics of the connector 10. In some embodiments, by making the structure 16 out of an insulator, the possibility of inadvertent shorts may be decreased.

Referring again to FIG. 2, if the thermal characteristics of the electronic device 20 are such that the device experiences less thermal expansion than the connector 10, then mechanical failure could occur in the connection between the two devices. This is because the connector 10 may expand more or less than the device 20. For example, in some cases, it may be desirable to form the connector 10 out of a liquid crystal polymer (LCP).

For example, a liquid crystal polymer may have desirable molding characteristics which make it a desirable candidate for forming a connector 10 which acts as a socket for another integrated circuit device. However, LCPs have coefficients of thermal expansion which may be significantly greater than those of conventional PCBs formed of common PCB materials such as FR4. Thus, when the devices are exposed to heat, differential thermal expansion may occur, resulting in failure. One instance where the devices may be exposed to considerable heat is when the devices are connected using thermal surface mount techniques such as solder reflow. Another situation which may expose the devices to high heat is thermal reliability testing.

By matching the thermal characteristics of the connector 10 to the thermal characteristics of the electronic device 20, the failure rate due to differential thermal expansion may be reduced. By matching the thermal expansion of the structure 16 to those of the electronic device 20, the thermal expansion characteristics of the overall composite connector 10 may be controlled to match those of the electronic device 20. Namely, the structure 16 may be of sufficient rigidity and strength that it restrains thermal expansion of the body 14 relative to the device 20. This may result in reduced differential thermal expansion and potentially in reduced failure rates of the connections.

While the structure 16 is shown as being integrated into the connector 14 using overmolding as an example, the structure 16 may be attached in a variety of other ways to control the thermal expansion of the body 14. Similarly, while the structure 16 is illustrated as being a grid-shaped structure, other shapes may be used as well, including sheet shapes, filamentary shapes and laminated arrangements. For example, a laminate containing particle fibers which have desired thermal characteristics can be formed in the body 14. Similarly, particles of desired thermal characteristics may be integrated into the material which forms the body 14 to control thermal expansion.

In one embodiment the device 18 may be a processor. The connector 10 may be a ball grid array socket and the device 20 may be a PCB. The socket may be formed of copper wire overmolded by LCP.

While the present invention has been described with respect to a limited number of embodiments, those skilled in the art will appreciate numerous modifications and variations therefrom. It is intended that the appended claims cover all such modifications and variations as fall within the true spirit and scope of the present invention.

What is claimed is:

1. An electrical coupling comprising a body and a structure coupled to the body to limit the thermal expansion of said body, said structure including a first set of filaments extending in a first direction and a second set of filaments extending generally transversely thereto.

2. The coupling of claim 1 wherein said body has a first coefficient of thermal expansion and said structure has a second coefficient of thermal expansion, said structure adapted to cause said body to substantially exhibit said second coefficient of thermal expansion.

3. The coupling of claim 2 wherein said structure is integrated within said body.

4. The coupling of claim 3 wherein said body is formed by molding and said structure is molded into said body.

5. The coupling of claim 2 wherein said body includes elements that couple said body to a pair of electronic devices.

6. The coupling of claim 5 wherein said body includes a surface mount connection.

7. The coupling of claim 2 wherein said body has two sides and is adapted to receive an integrated circuit device on one side and to make a surface mount connection to a printed circuit board on the other side.

8. The coupling of claim 2 wherein said structure is formed of copper wire.

9. The coupling of claim 8 wherein said structure is formed of copper wire arranged in a transverse grid pattern.

10. The coupling of claim 2 wherein the coefficient of thermal expansion of said structure is less than the coefficient of thermal expansion of said body.

11. The coupling of claim 10 wherein said body is formed of a liquid crystal polymer.

12. A method of coupling electronic components comprising:

securing a structure having a coefficient of thermal expansion to a body having a different coefficient of thermal expansion than said structure; and securing said body to an electronic device having a coefficient of thermal expansion that substantially matches the coefficient of thermal expansion of said structure.

13. The method of claim 12 further including surface mounting said body on a printed circuit board.

14. The method of claim 12 further including plugging a packaged integrated circuit into said body and electrically coupling said integrated circuit through said body to another electronic device.

15. The method of claim 12 further including forming said body by molding.

16. The method of claim 15 further including overmolding said structure into said body.

17. A socket for coupling one electronic device physically and electrically to another electronic device, said socket comprising:

a body having a first coefficient of thermal expansion; and a plurality of filaments having a second coefficient of thermal expansion extending through said body to limit the coefficient of thermal expansion of said body to said second coefficient of thermal expansion, said filaments including a first set of filaments extending in a first direction and a second set of filaments extending generally transversely thereto.

18. The socket of claim 17 wherein said socket is a surface mount socket.

19. The socket of claim 18 wherein said filaments comprise a plurality of generally parallel wires.

20. The socket of claim 19 including a first set of wires extending in a first direction and a second set of wires extending generally transversely thereto.

* * * * *